US 7,239,769 B2

(12) United States Patent
Yang et al.

(10) Patent No.: US 7,239,769 B2
(45) Date of Patent: *Jul. 3, 2007

(54) NANOWIRE OPTOELECTRIC SWITCHING DEVICE AND METHOD

(75) Inventors: Peidong Yang, Berkeley, CA (US);
Hannes Kind, Emeryville, CA (US);
Haoquan Yan, Albany, CA (US);
Matthew Law, San Jose, CA (US);
Benjamin Messer, El Cerrito, CA (US)

(73) Assignee: The Regents of the University of California, Berkeley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/026,576

(22) Filed: Dec. 30, 2004

(65) Prior Publication Data

US 2006/0054982 A1 Mar. 16, 2006

Related U.S. Application Data

(63) Continuation of application No. 10/032,698, filed on Dec. 27, 2001, now Pat. No. 6,882,767.

(51) Int. Cl.
*G02B 6/26* (2006.01)
(52) U.S. Cl. .............................. 385/16; 385/8; 385/12; 385/16
(58) Field of Classification Search ............... None
See application file for complete search history.

(56) References Cited

U.S. PATENT DOCUMENTS 6,123,819 A    9/2000  Peeters
6,438,025 B1   8/2002  Skarupo
2002/0117659 A1 8/2002  Lieber et al.
2002/0130311 A1 9/2002  Lieber et al.

OTHER PUBLICATIONS

Bockrath et al., "Single-Electron Transport in Ropes of Carbon Nanotubes", Science, Mar. 28, 1997, vol. 275, www.sciencemag.org.
Dekker, "Carbon Nanotubes as Molecular Quantum Wires", Physics Today, 1999 American Institute of Physics, S-0031-9228-9905-0103.

(Continued)

*Primary Examiner*—Frank G. Font
*Assistant Examiner*—Eric Wong
(74) *Attorney, Agent, or Firm*—Townsend and Townsend and Crew LLP

(57) ABSTRACT

A nanowire switching device and method. The device has a nanowire structure comprising an elongated member having a cross-sectional area ranging from about 1 nanometers but less than about 500 nanometers, but can also be at other dimensions, which vary or are substantially constant or any combination of these. The device also has a first terminal coupled to a first portion of the nanowire structure; and a second terminal coupled to a second portion of the nanowire structure. The second portion of the nanowire structure is disposed spatially from the first portion of the nanowire structure. An active surface structure is coupled to the nanowire structure. The active surface structure extends from the first portion to the second portion along the elongated member.

26 Claims, 15 Drawing Sheets

OTHER PUBLICATIONS

Duan et al., "Indium phosphide nanowires as building blocks for nanoscale electronic and optoelectronic devices", Letters to Nature, Jan. 4, 2001, vol. 409.

Fuhrer et al., "Crossed Nanotube Junctions", Science, Apr. 21, 2000, vol. 28, www.sciencemag.org.

Hu et al., "Controlled growth and electrical properties of heterojunctions of carbon nanotubes and silicon nanowires", Letters to Nature, May 6, 1999.

Huang et al., "Room-temperature ultraviolet nanowires nanolasers", Science, Jun. 8, 2001, vol. 292, www.sciencemag.org.

Kong et al., "Full and Modulated Chemical Gating of Individual Carbon Nanotubes by Organic Amine Compounds", J. Phys. Chem. B 2001, 105, 2890-2893, published on Web Mar. 22, 2001.

Liu et al., "Ultraviolet Detectors based on Epitaxial ZnO Films Grown by MOCVD".

Martel et al., Single-and multi wall carbon nanotube field-effect transistors, Applied Physics Letters, Oct. 26, 1998, vol. 73, No. 17.

Tans et al., "Individual single-wall carbon nanotubes as quantum wires", Letters to Nature, Apr. 3, 1997, vol. 386.

Tans et al., "Room-temperature transistor based on a single carbon nanotube", Letters to Nature, May 7, 1998, vol. 393.

Takahashi et al., "Photoconductivity of Ultrathin Zinc Oxide Films", Jpn. J. Appl. Phys., 1994, vol. 33, Pt. 1., No. 12A.

Yao et al., "Carbon Nanotubes intramolecular junctions", Letters to Nature, Nov. 18, 1999, vol. 402, 18.

Yu et al., "Silicon Nanowires: Preparation, Device Fabrication, and Transport Properties", J. Phys. Chem. B 2000, 104, 11864-11870.

NANOWIRE OPTOELECTRIC SWITCHING DEVICE AND METHOD

STATEMENT AS TO RIGHTS TO INVENTIONS MADE UNDER FEDERALLY SPONSORED RESEARCH OR DEVELOPMENT

This invention was made with Government support under Grant No. NSF DMR0092086 Awarded by the National Science Foundation. The Government has certain rights to this invention.

BACKGROUND OF THE INVENTION

The present invention generally relates to a nanowire optoelectric switching structure and method. More particularly, the invention provides a device and method for switching a signal using a nanowire via electro-optic means. Merely by way of example, the invention is applied to switching electrical signals of a switching device. But it would be recognized that the invention has a much wider range of applicability. For example, the invention can be applied to other types of switching devices, such as chemical detectors, sensors, MEMS, MOEMS, biostructures, photodetectors, humidity sensors, and the like.

Through the years, many techniques have been developed to carry signals through a medium. For example, electrical wires carry power from one location to another for the purpose of lighting, heating, and operating complex equipment, among other devices. Electrical wires are often lengths of copper or other conductive material such as aluminum or alloys and the like. Such electrical wires have also been used in devices for carrying electrical signals. As merely an example, discrete devices such as relays and smaller devices including solid state transistors have been used to switch electrical signals. As time progressed, such devices became smaller and smaller to switch more and more signals in a smaller given area. Robert N. Noyce invented what we understand as the "integrated circuit," which is described in U.S. Pat. No. 2,981,877, titled Semiconductor Device-And-Lead Structure, filed Jul. 30, 1959, and issued Apr. 25, 1961 (herein the "Noyce patent"). The Noyce patent generally describes a technique for interconnecting two contact regions for manufacturing an integrated circuit. The Noyce patent was one of the many techniques which has been developed for making semiconductor devices more integrated and closely packed such that more and more transistors can be designed in a given area. The Noyce patent, however, is limited to conventional ways of manufacturing and operating semiconductor integrated circuits.

Although such integrated circuits have been successful, industry has explored other ways and materials to carry signals in smaller devices. As merely an example, nanowires have been developed to carry electrical signals. Jae-Yong Yu, et al., "Silicon Nanowires: Preparation, Device Fabrication, and Transport Properties," J. Phys. Chem. B 2000, 104, 11864-11870, generally describes techniques and properties of such nanowires. Nanowires are often thin strands of conductive or semiconductive materials. Such strands often have a characteristic diameter in the nanometer range to a few hundred nanometers. A characteristic length of such strands ranges from about 1 micrometer and greater. Another example illustrating a way to use such nanowire as a device has been described in Michael H. Huang, et al., "Room-Temperature Ultraviolet Nanowire Nanolasers," SCIENCE, Vol. 292, 8 Jun. 2001 (herein "Huang, et al."). Huang, et al. generally relates to a room-temperature, ultraviolet lasing in semiconductor nanowire arrays. Although there has been some work in manufacturing and using nanowires, such work has been limited.

From the above, it is seen that an improved way of manufacturing and using nanowires is highly desirable.

BRIEF SUMMARY OF THE INVENTION

According to the present invention, techniques for one or more signals using a nanowire structure is provided. More particularly, the invention provides a device and method for switching a signal using a nanowire via electro-optic means. Merely by way of example, the invention is applied to switching electrical signals of a switching device. But it would be recognized that the invention has a much wider range of applicability. For example, the invention can be applied to other types of switching devices, such as chemical detectors, sensors, MEMS, MOEMS, biostructures, photodetectors, humidity sensors, and the like.

In a specific embodiment, the invention provides a nanowire switching device. The device has a nanowire structure comprising an elongated member having a cross-sectional area ranging from about 3 nanometers but less than about 500 nanometers, but can also be at other dimensions, which vary or are substantially constant or any combination of these. The device also has a first terminal coupled to a first portion of the nanowire structure; and a second terminal coupled to a second portion of the nanowire structure. The second portion of the nanowire structure is disposed spatially from the first portion of the nanowire structure. An active surface structure is coupled to the nanowire structure. The active surface structure extends from the first portion to the second portion along the elongated member. The active surface is made of a semiconductor material such as ZnO, SiGe, Si, Ge, $SnO_2$, $Bi_2Te_3$, $TiO_2$, PbSe, PbS, GaN, and like materials.

In an alternative specific embodiment, the invention provides a method for switching an opto-electronic device. The opto-electronic device can be a sensing device (e.g., photodetector, humidity detector, chemical sensor), switching device, or the like. The method includes providing a nanowire structure having a surface region, which has a first chemical species attached to the surface region of the nanowire structure. The nanowire structure has the first chemical species for providing a first electrical state of the nanowire structure. The method includes illuminating energy onto the surface area of the nanowire structure to change the nanowire structure from the first electrical state to a second electrical state. The second electrical state allows a conduction characteristic of the nanowire to change from the first electrical state to the second electrical state.

In an alternative specific embodiment, the invention provides a nanowire opto-electronic switching device. The device has a nanowire structure comprising an elongated member having a cross-sectional diameter ranging from about 1 nanometers but less than about 500 nanometers. Alternatively, the nanowire structure can have other dimensions. The device also has a first terminal coupled to a first portion of the nanowire structure and a second terminal coupled to a second portion of the nanowire structure. The second portion of the nanowire structure is disposed spatially from the first portion of the nanowire structure. An active surface structure is coupled to the nanowire structure. The active surface structure extends from the first portion to the second portion along the elongated member. The nanowire structure has a first resistance value as measured between the first terminal and the second terminal while the active surface is subjected to a first level of electromagnetic radiation. The nanowire structure has a second resistance value as measured between the first terminal and the second terminal while the active surface is subjected to a second level of electromagnetic radiation.

Many benefits are achieved by way of the present invention over conventional techniques. For example, the present invention performs at room temperature, rather than conventional solid state sensing devices that operate at much higher temperatures. Such sensors can only operate at such elevated temperatures, which often require a heating element or the like. Safe sensing in explosive environments since this is a room-temperature sensing scheme in some embodiments. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for one or more signals using a nanowire structure is provided. More particularly, the invention provides a device and method for switching a signal using a nanowire via electro-optic means. Merely by way of example, the invention is applied to switching electrical signals of a switching device. But it would be recognized that the invention has a much wider range of applicability. For example, the invention can be applied to other types of switching devices, such as chemical detectors, sensors, MEMS, MOEMS, biostructures, photodetectors, humidity sensors, and the like.

Figure 1:
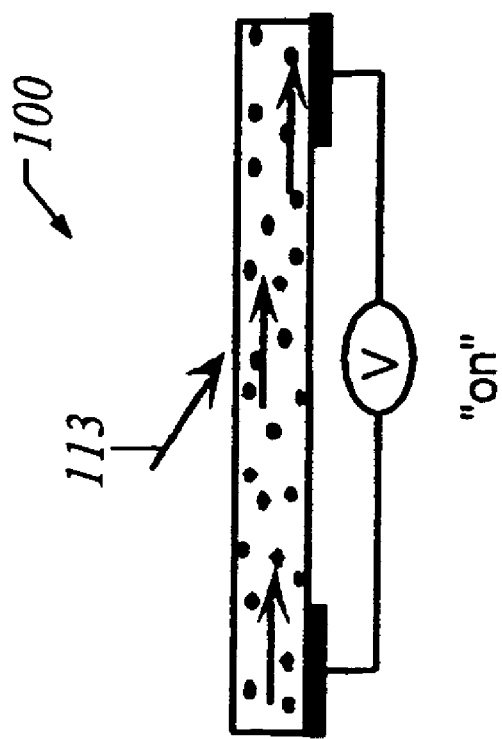
FIG. 1 are simplified side-view diagrams of a nanowire switch according to an embodiment of the present invention.
Figure 1:
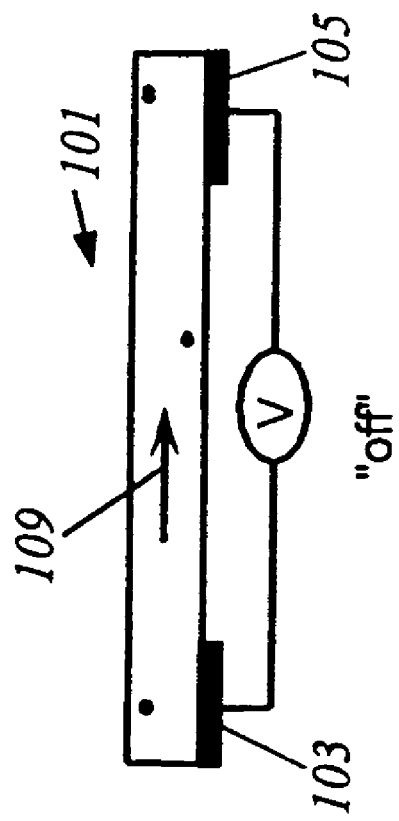

FIG. 1 are simplified side-view diagrams of a nanowire switch 100 according to an embodiment of the present invention. These diagrams are merely examples and should not unduly limit the scope of the claims herein. One of ordinary skill in the art would recognize many other variations, modifications, and alternatives. As shown, the nanowire switching device 100 has a nanowire structure 101. The structure includes an elongated member having a cross-sectional area ranging from about 1 nanometers but less than about 500 nanometers, but can also be at other dimensions, which vary or are substantially constant or any combination of these. The device also has a first terminal 103 coupled to a first portion of the nanowire structure and a second terminal 105 coupled to a second portion of the nanowire structure. The second portion of the nanowire structure is disposed spatially from the first portion of the nanowire structure. An active surface structure is coupled to the nanowire structure. The active surface structure extends from the first portion to the second portion along the elongated member.

In a specific embodiment, the nanowire device can be operated as a switch using electromagnetic radiation. As shown, a potential can be measured between the first terminal and the second terminal. In a specific embodiment, the device is shown in an "OFF" state, where electrical current from between the first terminal and the second terminal is essentially zero or other nominal value, which causes an OFF state of the device. To turn the device to an "ON" state, electromagnetic energy 113 is applied to the surface of the nanowires structure, as shown. In a specific embodiment, the electromagnetic energy is light, which can range in 200 nanometers to about 400 nanometers, but can also include others. In a specific embodiment, the device is shown in an ON state, where electrical current from between the first terminal and the second terminal is flowing between the first terminal and the second terminal, which causes an ON state of the device. In a specific embodiment where the nanowire structure is made of a ZnO material, the nanowire structure is now in a conductive state, where the resistance of the devices ranges from about 300 ohm-cm and less, but can be at other values. The device can be switched ON and OFF at room temperature other suitable temperatures.

Preferably, the nanowire device operates using a chemical species that changes the nanowire structure from a resistive state to a conductive state or a conductive state to a resistive state upon application of electromagnetic energy in the form of light. Here, the nanowire device is an opto-electronic device, which includes sensing devices (e.g., chemical sensor, bio-sensor), switching device, or the like. Further details of such nanowire structure are provided throughout the present specification and more particularly below.

A method according to an embodiment of the present invention can be provided as follows:

1. Provide nanoswitch structure, including first terminal and second terminal, such as the one noted above but can also be others;
2. Apply voltage between the first terminal and the second terminal, where the nanoswitch structure is in a substantially non-conductive state;
3. Measure electrical current between the first terminal and the second terminal;
4. Apply illumination on active surface of the nanoswitch structure;
5. Change conductive state of the nanoswitch structure to conductive;
6. Measure electrical current between the first terminal and the second terminal;
7. Increase illumination on the active surface, while measuring the current between the first terminal and the second terminal;
8. Measure the gain in the current as the illumination increases; and
9. Perform other steps, as desired.

The above sequence of steps provides a way to operate the nanoswitch device according to an embodiment of the present invention. As described, the present invention provides a non-contact way of changing a resistive state of the nanowire structure. The electrical current provided through the device may be proportional to the level of illumination provided on the active surface of the device. These and other features of the invention are provided throughout the present specification and more particularly below.

Figure 2:
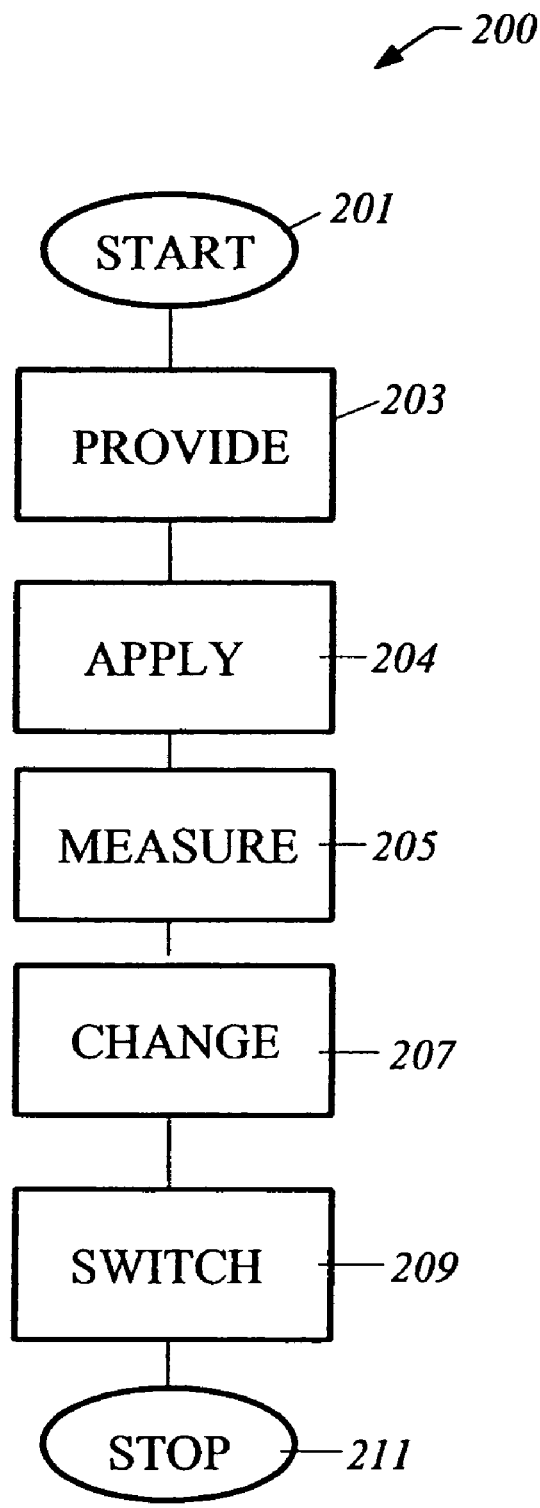
FIG. 2 is a simplified diagram of a switching method according to an embodiment of the present invention.

FIG. 2 is a simplified diagram of a switching method 200 according to an embodiment of the present invention. This diagram is merely an example and should not unduly limit the scope of the claims herein. One of ordinary skill in the art would recognize many other variations, modifications, and alternatives. As shown, the method begins at start, step 201. Next, the method provides (step 203) a nanoswitch structure, including first terminal and second terminal, such as the one noted above but can also be others. The nanoswitch structure is often made of a semiconductor material such as ZnO, SiGe, Si, Ge, $SnO_2$, GaN, TiO2, Bi2Te3, PbSe, PbS, and other like materials. The method applies (step 204) voltage between the first terminal and the second terminal, where the nanoswitch structure is in a substantially non-conductive state. In a specific embodiment, the resistivity value between the first and second terminals is greater than about 3,000,000 ohm.cm for a ZnO material. Of course, the resistance value depends upon the type of material for the specific application.

The method measures (step 205) electrical current between the first terminal and the second terminal. When the nanostructure is not subjected to electromagnetic radiation, substantially no current flows through it. Illumination is then applied on active surface of the nanoswitch structure, which changes (step 207) the conductive state of the nanoswitch structure to conductive. Current is now measured between the first terminal and the second terminal. Accordingly, the nanostructure has switched (step 209) from a non-conductive state to a conductive state. Depending upon the application, the method stops, step 211. As merely an example, further details of such switching states are provided throughout the specification and more particularly by way of FIGS. 3 and 5. In a specific embodiment, the method increases illumination on the active surface, while measuring the current between the first terminal and the second terminal. Preferably, the current increases as the illumination increases. An example of such current increase is provided by FIG. 4, which is described below.

Figure 3:
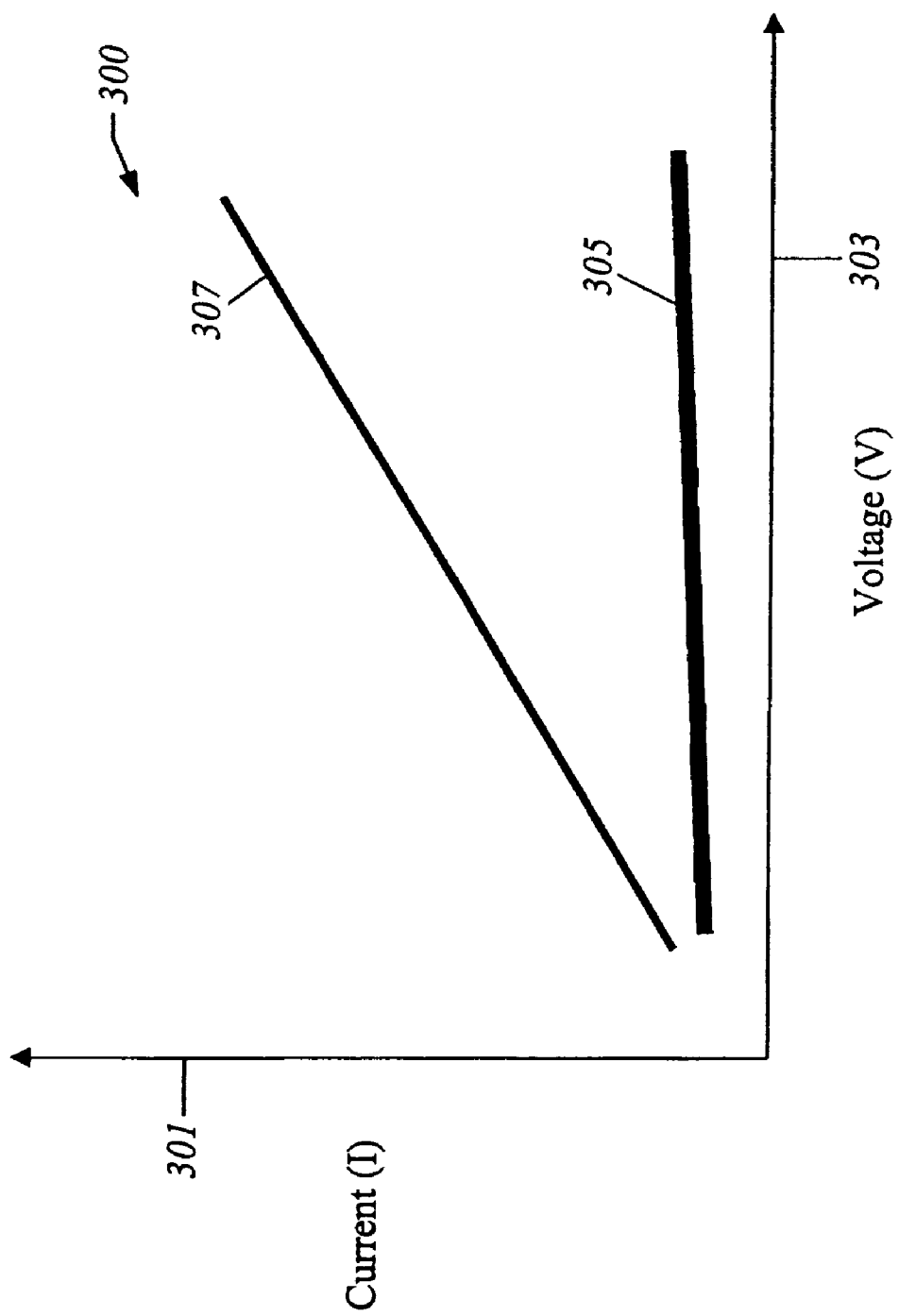
FIG. 3 is a simplified diagram of current plotted against voltage for a nanowire switch according to an embodiment of the present invention.

FIG. 3 is a simplified diagram 300 of current plotted against voltage for a nanowire switch according to an embodiment of the present invention. This diagram is merely an example and should not unduly limit the scope of the claims herein. One of ordinary skill in the art would recognize many other variations, modifications, and alternatives. In operation, our present nanowire switch operates using electromagnetic radiation to switch the device from a first resistance value to a second resistance value, which allows electrical current to propagate therethrough. As shown, the diagram includes a vertical axis 301, which is current in Amperes, and a horizontal axis 303, which is voltage in Volts. The diagram has two plots, including a photocurrent plot 307 and a dark current plot 305. The photocurrent plot shows that current increases as voltage increases, which is the way the present switch behaves. Such photocurrent plot occurs when electromagnetic radiation is applied to the active surface of the nanowire device, which provides an ON state of the device. Alternatively, electrical current does not substantially increase as voltage increases when the electromagnetic radiation is not applied, rendering an OFF state of the device. Further details of such plot are provided throughout the present specification and more particularly below.

Figure 4:
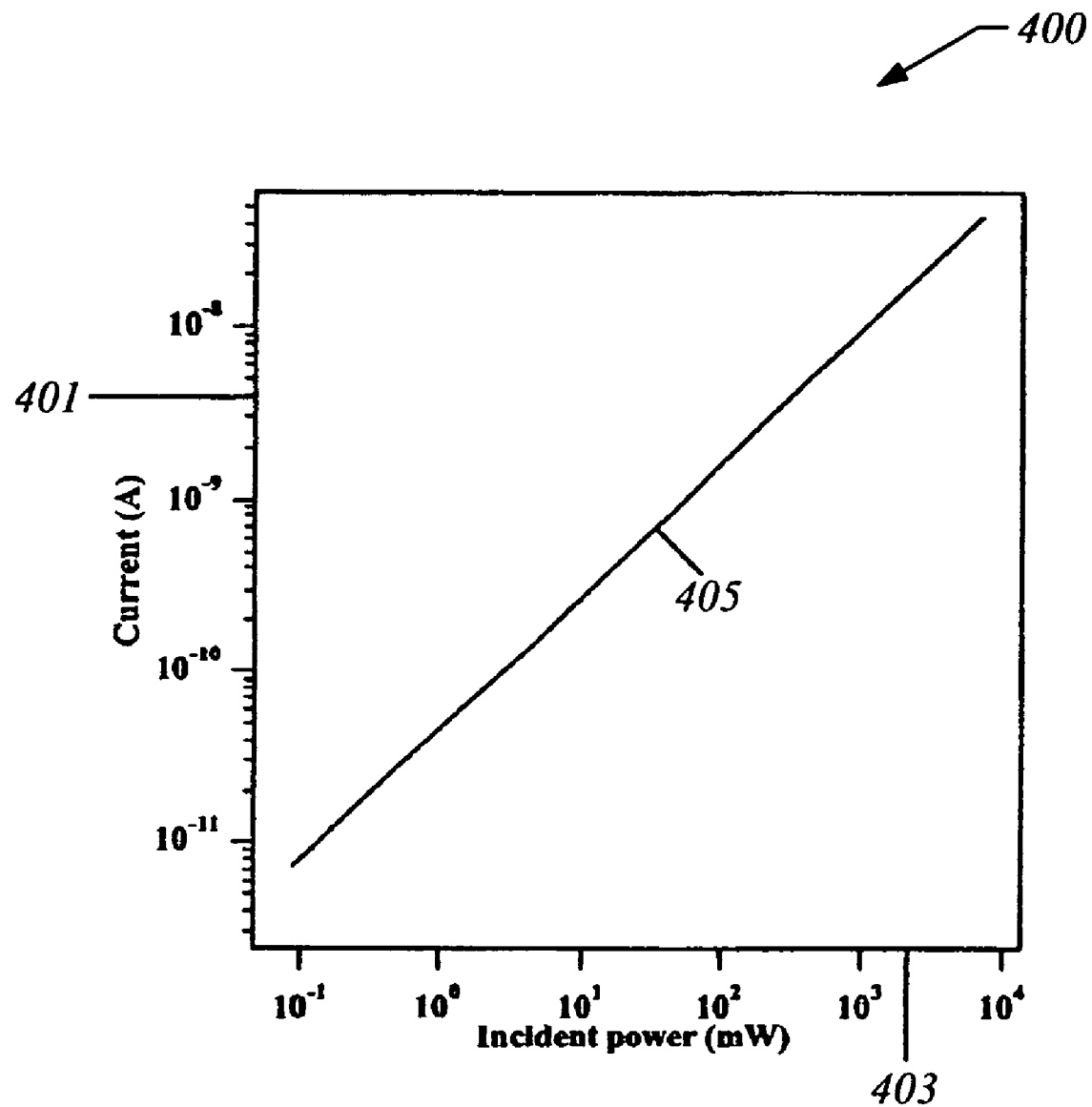
FIG. 4 is a simplified diagram of current plotted against incident power for a nanowire switch according to an embodiment of the present invention.

FIG. 4 is a simplified diagram 400 of current plotted against incident power for a nanowire switch according to an embodiment of the present invention. This diagram is merely an example and should not unduly limit the scope of the claims herein. One of ordinary skill in the art would recognize many other variations, modifications, and alternatives. As shown, the includes a vertical axis 401, which is current in Amperes, and a horizontal axis 403, which is incident power. The incident power is the electromagnetic radiation (e.g., light), which is incident on the active surface of the nanowire device. Plot 405 illustrates that current through the device increases proportionately as incident power increases (although the diagram is shown in a non-linear scale).

Figure 5:
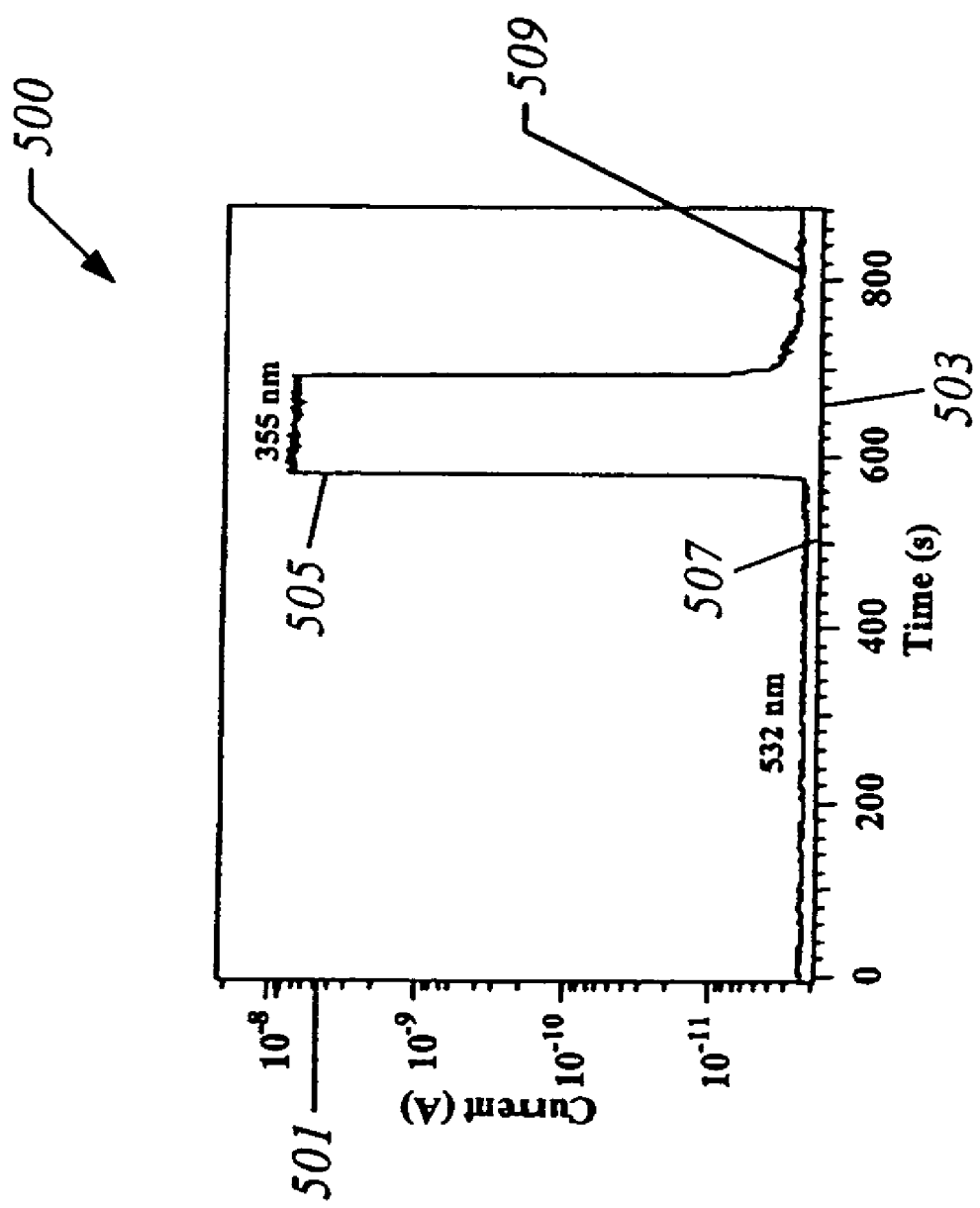
FIG. 5 is a simplified diagram of current plotted against time for a nanowire switch according to an embodiment of the present invention.

FIG. 5 is a simplified diagram 500 of current plotted against time for a nanowire switch according to an embodiment of the present invention. This diagram is merely an example and should not unduly limit the scope of the claims herein. One of ordinary skill in the art would recognize many other variations, modifications, and alternatives. As shown, the diagram 500 includes a vertical axis 501, which is electrical current in Amperes, and a horizontal axis 503, which is time in seconds. Here, the active surface of the light is illuminated with electromagnetic radiation (e.g., light) at 355 nm 505, for example. As shown, current 505 flows in a step-like manner, which provides an ON-state characteristic through the nanowire structure, such as the one described above, but can be others. Alternatively, substantially no current flows in regions 407 and 409 where light is not illuminated onto the active surface of the nanowire structure, which provides on OFF-state characteristic.

Figure 6:
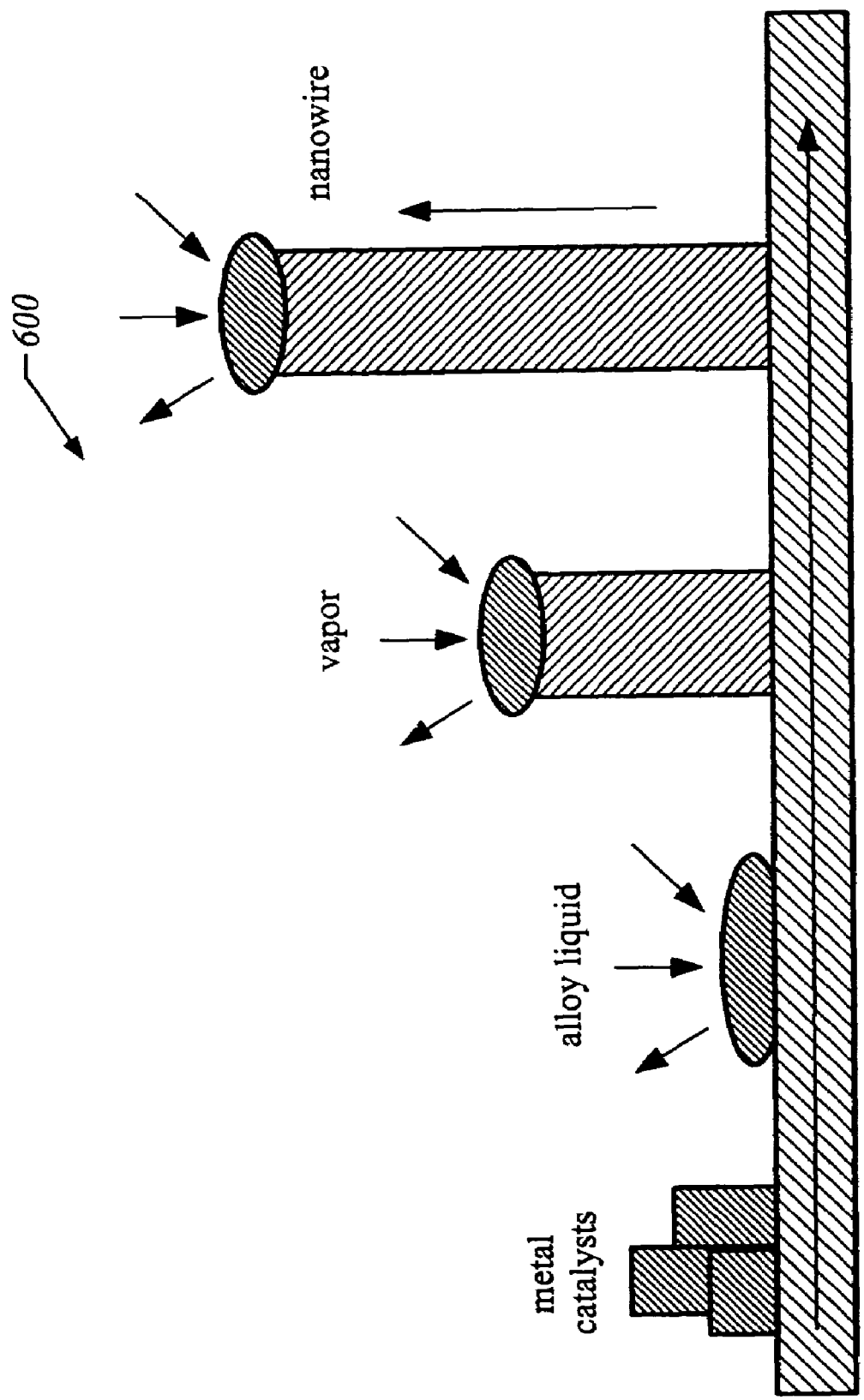
FIG. 6 are illustrations of ways to manufacture a nanowire structure according to an embodiment of the present invention.

FIG. 6 are illustrations of ways to manufacture 600 a nanowire structure according to an embodiment of the present invention. This diagram is merely an example and should not unduly limit the scope of the claims herein. One of ordinary skill in the art would recognize many other variations, modifications, and alternatives. As shown, the nanowire structure is grown using a chemical vapor deposition process. An example of such a process is described in Huang, et al., which was noted above, but can be formed by other ways. Once the nanowire has been fabricated, terminals are attached to the wire. Packaging can also be provided, depending upon the application. Further examples of the nanowire growth and nucleation process are provided below.

Figure 7:
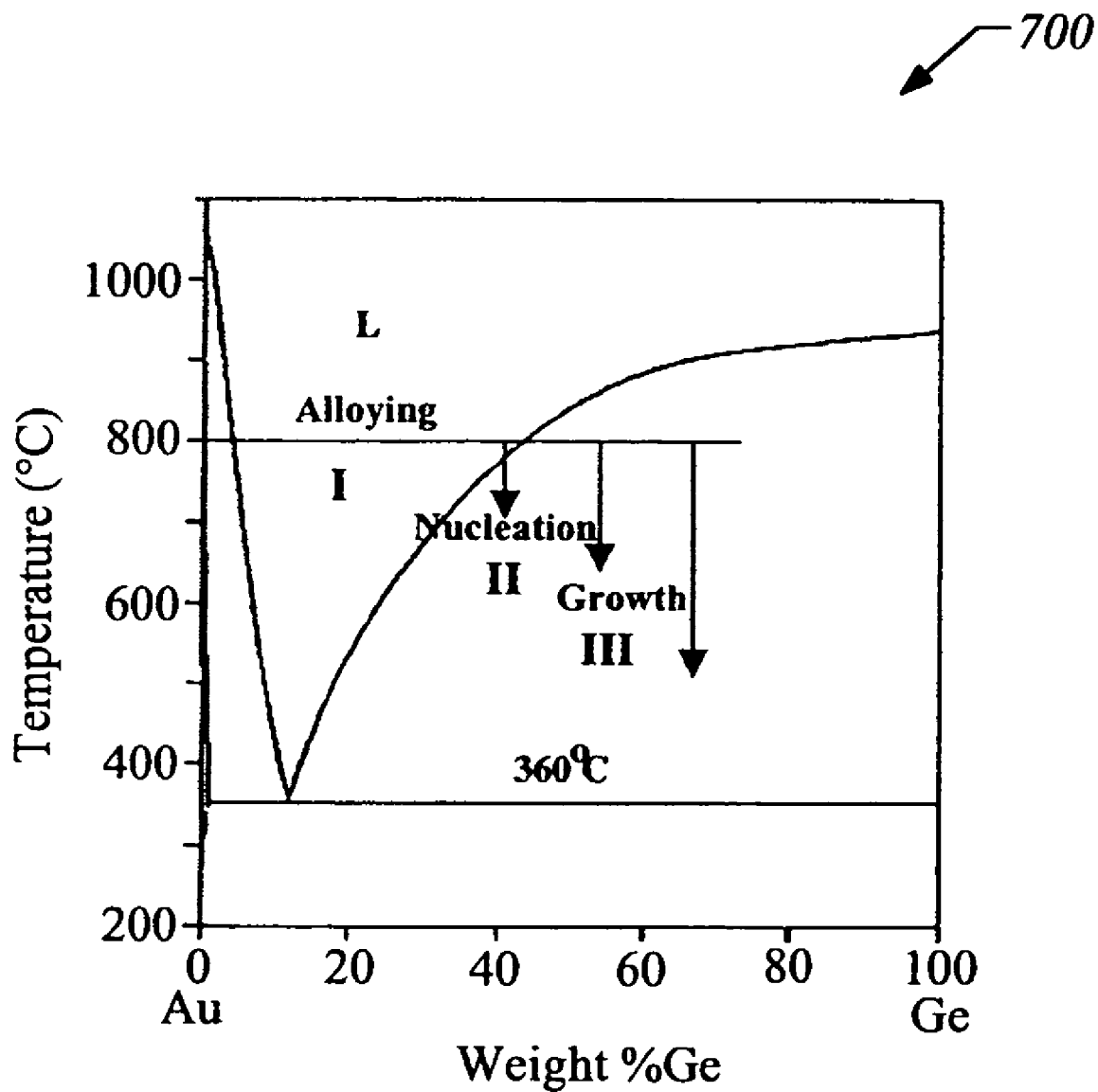
FIG. 7 is a simplified diagram of temperature plotted against composition for a nanowire structure according to an embodiment of the present invention.

FIG. 7 is a simplified diagram 700 of temperature plotted against composition for a nanowire structure according to an embodiment of the present invention. This diagram is merely an example and should not unduly limit the scope of the claims herein. One of ordinary skill in the art would recognize many other variations, modifications, and alternatives. As shown, the vertical axis represents temperature, which is in Celsius, while the horizontal axis represents percentage weight of germanium (Ge). As shown, the plots shows alloying I, nucleation II, and growth III, as well as other features.

Figure 8:
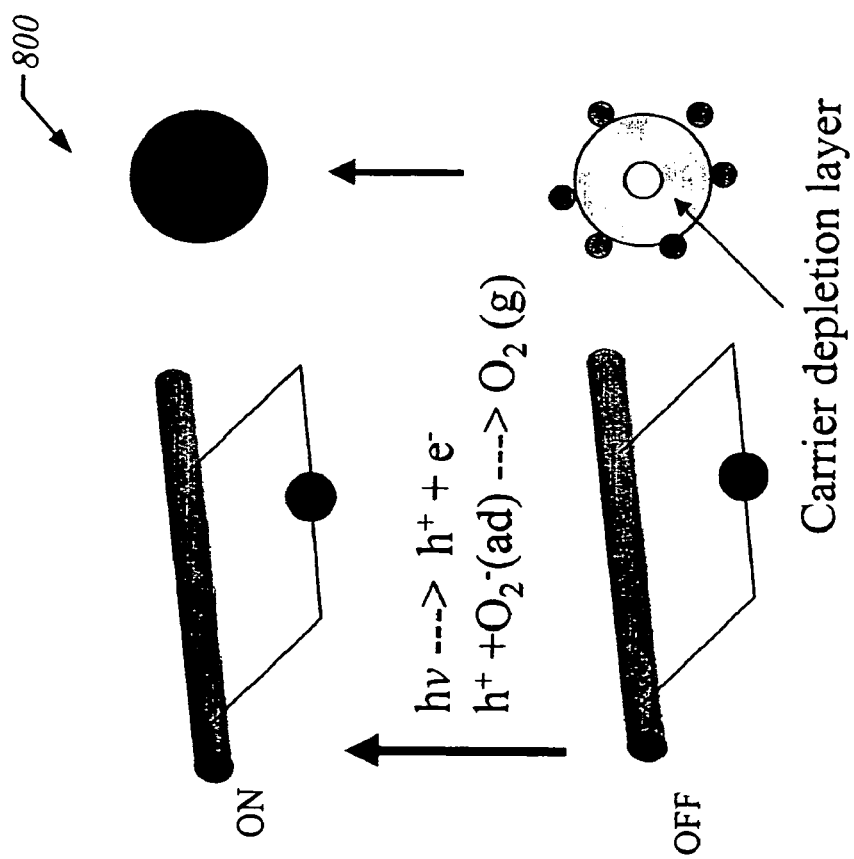
FIG. 8 are simplified side-view diagrams of a nanowire chemical sensor according to an embodiment of the present invention.

FIG. 8 are simplified side-view diagrams 800 of a nanowire chemical sensor according to an embodiment of the present invention. This diagram is merely an example and should not unduly limit the scope of the claims herein. One of ordinary skill in the art would recognize many other variations, modifications, and alternatives. As shown, the sensor has an ON state and an OFF state. In the OFF state, there exists a carrier depletion layer. Oxygen molecules in an ionic state attach themselves around the surface of the device, which makes the device substantially non-conductive. Here, negative charge characteristics of the oxygen molecules make the device substantially non-conductive. Energy is applied to the device, which turns the oxygen ions into oxygen gas. Then, the device has a conductive state.

Figure 9:
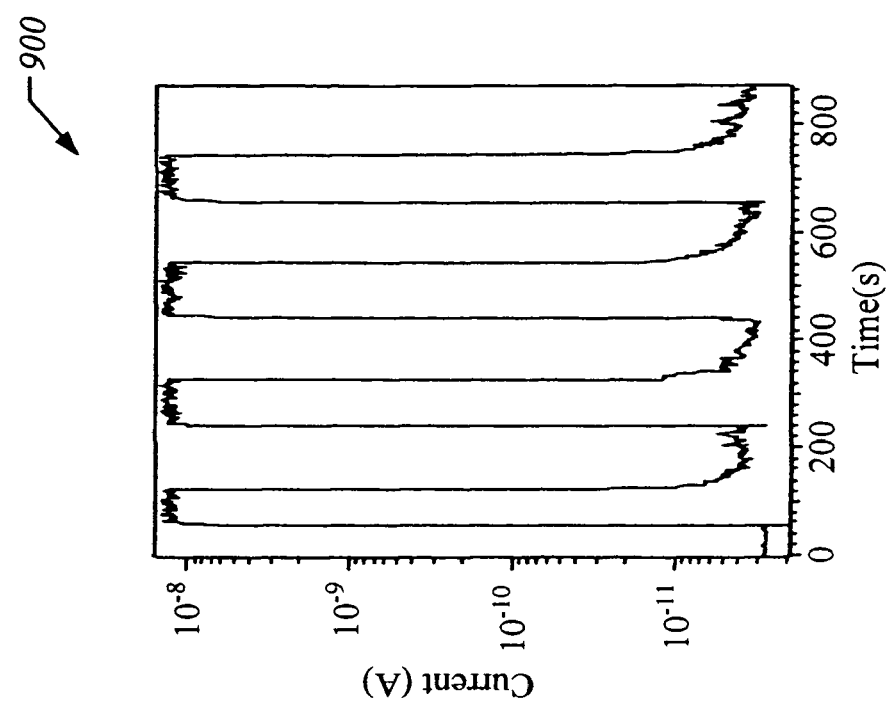
FIG. 9 is a simplified diagram of current plotted against time for a nanowire chemical sensor according to an embodiment of the present invention.

FIG. 9 is a simplified diagram 900 of current plotted against time for a nanowire chemical sensor according to an embodiment of the present invention. This diagram is merely an example and should not unduly limit the scope of the claims herein. One of ordinary skill in the art would recognize many other variations, modifications, and alternatives. As shown, current flows in a selected manner based upon whether the device is in an ON state or an OFF state. These and other features of the invention are provided throughout the present specification and more particularly below.

While the above is a full description of the specific embodiments, various modifications, alternative constructions and equivalents may be used. Therefore, the above description and illustrations should not be taken as limiting the scope of the present invention which is defined by the appended claims.

EXAMPLES

To prove the principle and operation of the present invention, we performed experiments. These experiments were merely examples and should not unduly limit the scope of the inventions defined by the claims herein. One of ordinary skill in the art would recognize many other variations, modifications, and alternatives. As we will demonstrate, highly sensitive ultraviolet optical sensors based on individual zinc oxide nanowires were demonstrated. Upon exposure to ultraviolet light, electrical resistivity of the semiconducting nanowires was found to decrease by 4 to 6 orders of magnitude. This transition serves as the basis for nanowire opto-electronic binary switches, which exhibit high sensitivity, selectivity and excellent reversibility at room temperature. Such nanowire devices may also have implications in single photon detection, as well as in chemical and biological sensors.

We have demonstrated that nanowires and nanotubes could be ideal building blocks for nanoscale optoelectronics, since they can function as miniaturized devices as well as the electrical interconnects. Nano-devices such as field-effect transistors, single-electron transistors, metal-semiconductor junctions, and intermolecular crossed junctions have been demonstrated. Many of these devices rely on switching between "ON" and "OFF" states, which is often for important applications such as memory storage and logic circuits. Switching on the nanometer and molecular level has been achieved through proper electrical gating, as exemplified by nanotube transistors. No attention has been, however, given to the photoconducting properties of nanowires despite possibilities for use in optoelectronic circuits. Here, we showed the possibility of creating highly sensitive nanowire switches by exploring the photoconducting properties of individual semiconductor nanowires. We found that the conductivity of the ZnO nanowires is sensitive to ultraviolet light exposure. The light-induced conductivity increase allows us to reversibly switch the nanowires from "OFF" to "ON" states, an "optical gating" phenomenon analogous to the commonly used electrical gating.

The ZnO nanowires used in the experiments were grown by a vapor phase transport process developed in our lab. The diameters of these wires range from 50 to 300 nm. To characterize their photoconducting properties, the nanowires were dispersed directly on pre-fabricated gold electrodes. Alternatively, electron-beam lithography was also used to fabricate gold electrodes on top of the nanowires. Field emission scanning electron microscopy (FE-SEM) was used to image the ZnO nanowire devices. Measurement of their electrical resistivity was performed in four-terminal configuration in an air, nitrogen, or vacuum environment.

Figure 10:
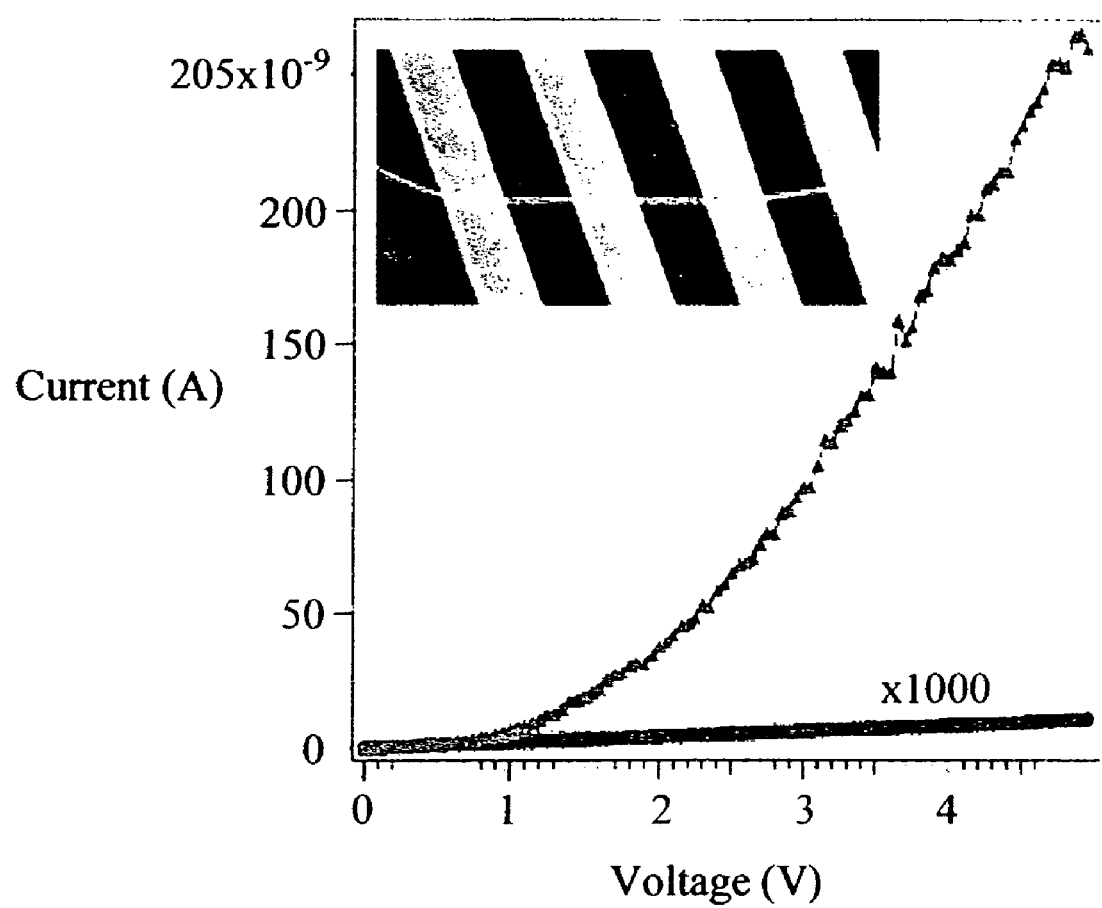
FIG. 10 illustrates I-V curves show dark current and photocurrent of a single ZnO nanowire under 365 nm, 0.3 mWcm$^{-2}$ UV-light illumination.

Four-terminal measurements of individual ZnO nanowires indicate that these nanowires were insulating in the dark with a resistivity above 3.5 Mohm.cm. When the nanowires are exposed to UV-light with wavelengths below 400 nm (handheld UV-lamp, 0.3 mWcm-2, 365 nm), the nanowire resistivity decreases by typically 4 to 6 orders of magnitude. FIG. 10 shows the current-voltage (I-V) curve measured on a 60-nm nanowire in the dark and upon UV-light exposure. Larger photoresponse was detected at higher bias. We noticed that the I-V curve for the UV-exposed nanowire exhibits non-linear behavior. Same nonlinear I-V has been observed for both the wire-on-electrode and electrode-on-wire configurations. A comparison of the four-terminal with the two-terminal measurement shows essentially identical resistivity values, which suggests that Au/ZnO contacts may not contribute to the I-V non-linearity. The exact reason for this non-linearity remains unknown at this stage.

Figure 11:
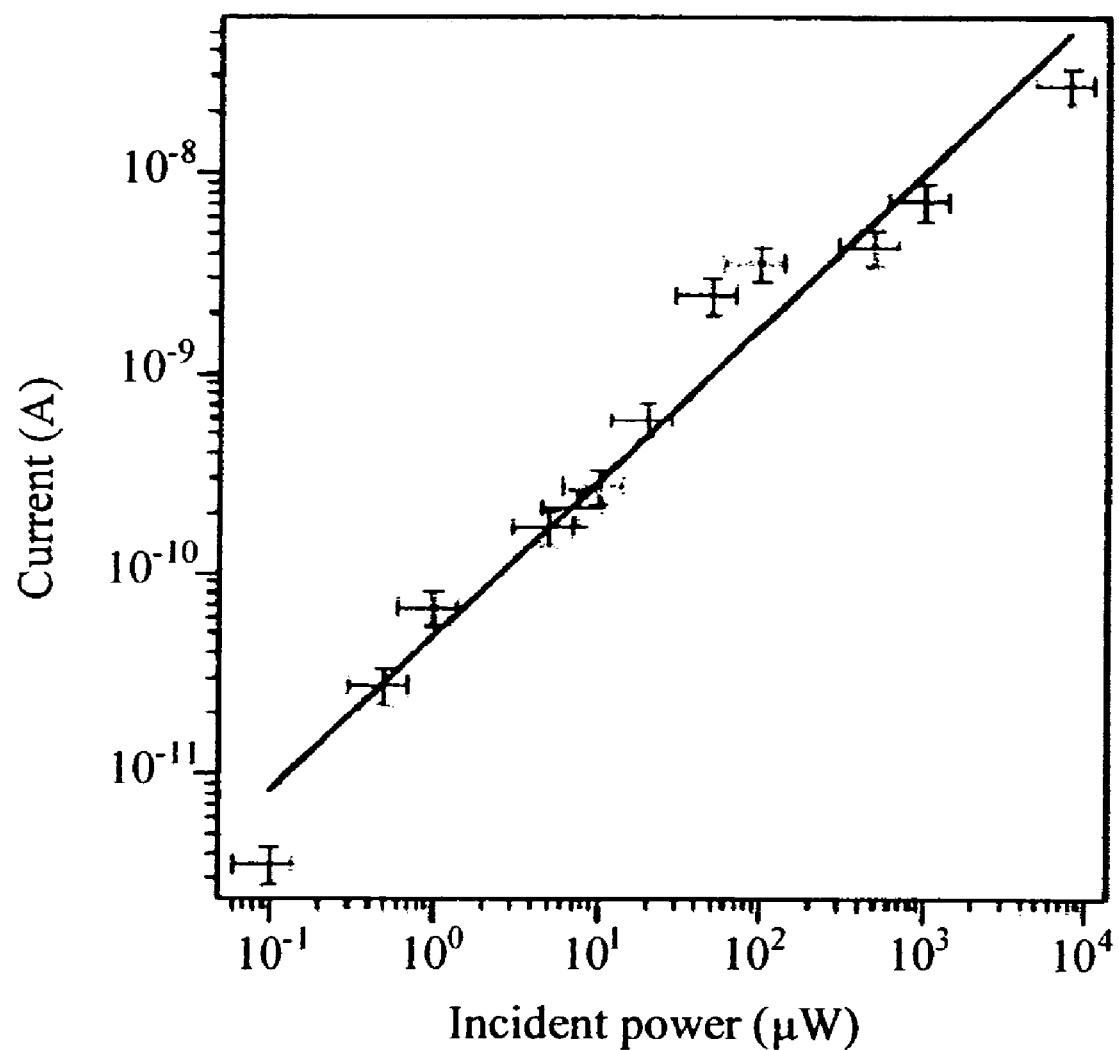
FIG. 11 illustrates variation of the photocurrent with the intensity of illumination at 355 nm for a ZnO nanowire.

The high sensitivity of the nanowire photoconductors can be seen in FIG. 11, which shows the power dependence of the photoresponse. The third harmonic of a Nd:YAG laser was used as the UV light source. Neutral density filters were used to change the incident UV light power. It was found that the photoresponse (Ipc) can be expressed by a simple power law Ipc P0.8, where P is the power of illumination. Depending on the power of illumination the resistivity can be reversibly changed by 4 to 6 orders of magnitude without damaging the nanowires.

Figure 12A:
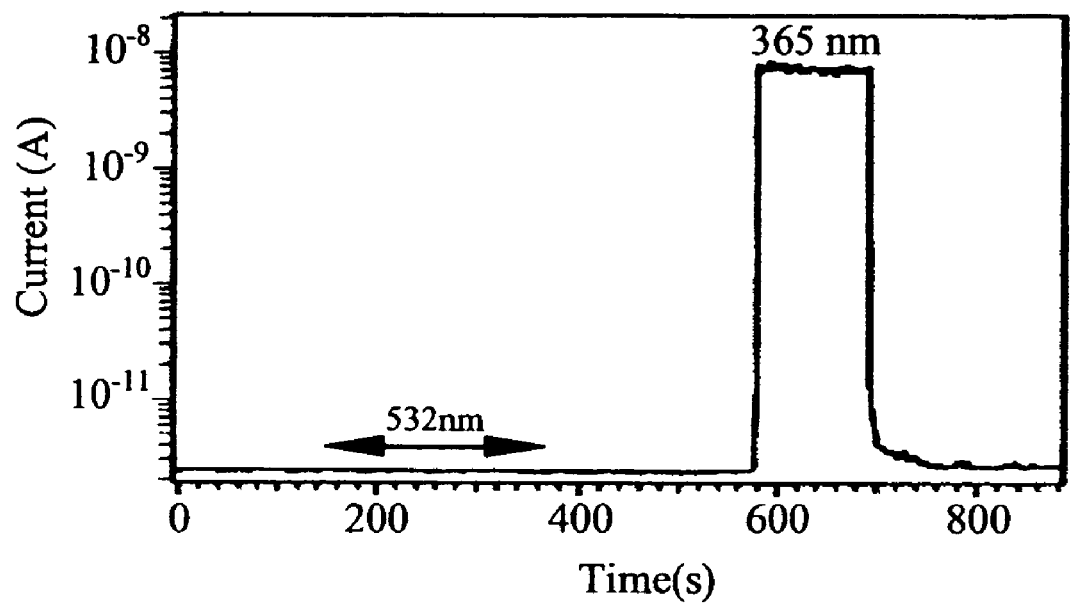
FIG. 12 illustrates (a) sensitivity of the photo response of a ZnO nanowire to light exposure at wavelengths of 532 nm and 365 nm (b) reversible switching of a ZnO nanowire between low and high conductivity states when the handheld UV lamp was turned on and off.

In addition to the sensitivity, nanowire photoconductors also exhibit a wavelength selectivity. FIG. 12a shows the evolution of the photocurrent when a nanowire was exposed first to highly intense light at 532 nm (Nd:YAG, second harmonic, 532 nm) for 200 s and then to UV-light at 365 nm. Green light does not induce a photoresponse, while exposure to less intense UV-light increases the conductivity by 4 orders of magnitude. Measurements of the spectral response show that our ZnO nanowires indeed have a response cutt-off wavelength of ~370 nm, which is expected from the wide band-gap (3.37 eV) of ZnO. In fact, sufficient photoresponse has been observed even with small percentage of UV light within the broadband light source such as the incandescent light or sun light.

It is known that oxygen chemisorption plays a profound role in regulating the photosensitivity of bulk or thin film ZnO. We believe that a similar mechanism is applicable to our nanowire system. In the dark, oxygen molecules adsorb on the nanowire surface as negatively charged ions by capturing free electrons from the n-type ZnO (O2(g)+e− O2-(ad)) thereby creating a depletion layer with low conductivity near the nanowire surface. Upon exposure to UV-light, photo-generated holes migrate to the surface and discharge the adsorbed oxygen ions (h+ +O2-(ad) O2(g)) through surface electron-hole recombination. Meanwhile, the photo-generated electrons significantly increase the conductivity of the nanowire. A simple calculation indicates about ~1000 electrons were generated per incident photon. This photoelectric gain suggests that an "optical" gating (analogous to the conventional electrical gating) is operating within these semiconductor nanowires rather than a simple light harvesting process. It is expected that thinner nanowires may further enhance the sensitivity of the devices due to an increased surface to volume ratio, which may lead to the capability of single photon detection.

Figure 12B:
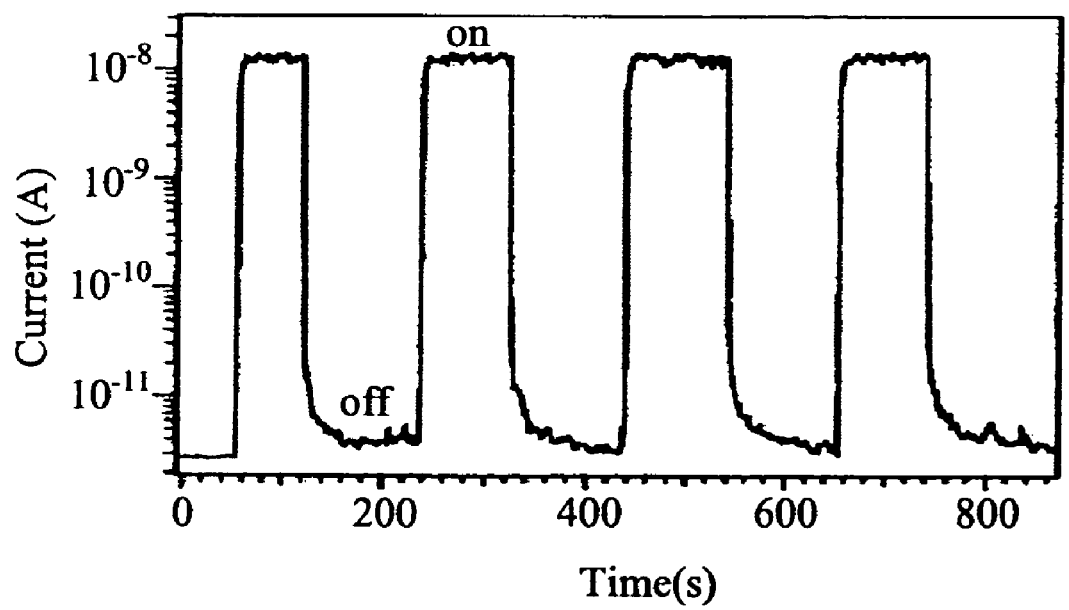

The characteristics of the photoconductive ZnO nanowires suggest that they are good candidates for optoelectronic switches, i.e. the insulating state in the dark as "OFF" and the UV-exposed conducting state as "ON". FIG. 12b plots the photoresponse as a function of time as the UV-lamp was switched on and off. It is evident that the nanowires can be reversibly switched between the low and the high conductivity state. The rise and decay times of the fastest nanowire switches are below our detection limit which is roughly 1 s. These photoconducting nanowires could serve as highly sensitive UV-light detectors, chemicals and biological sensors, as well as switching devices for nanoscale opto electronic applications where the "ON" and "OFF" states can be addressed optically.

In another experiment, we used the present invention as a chemical sensing device. This experiment is not intended to limit the scope of the claims herein. One of ordinary skill in the art would recognize many other variations, modifications, and alternatives. Here, we developed functional $NO_2$ gas sensors based on single $SnO_2$ nanoribbons. It is known that bulk granular $SnO_2$, as with metal oxides in general, is capable of sensing a variety of gaseous species, including hydrocarbons and various oxidizing gases. The sensing mechanism involves changes in carrier density due to the absorption/desorption of electron-donating or withdrawing molecules on low-energy surfaces of the material, and can be quantified by measuring conductance changes as a function of target gas concentrations over time. In order to enhance the kinetics enough to make such devices functional, bulk sensors operate at high temperature and often require complex designs. Our initial investigations have shown that single Ag-sensitized $SnO_2$ nanoribbons are capable of sensing the important pollutant gas $NO_2$ at room temperature down to levels of 3-10 ppm, near important concentrations for pollution-monitoring in industry and transportation.

Figure 13:
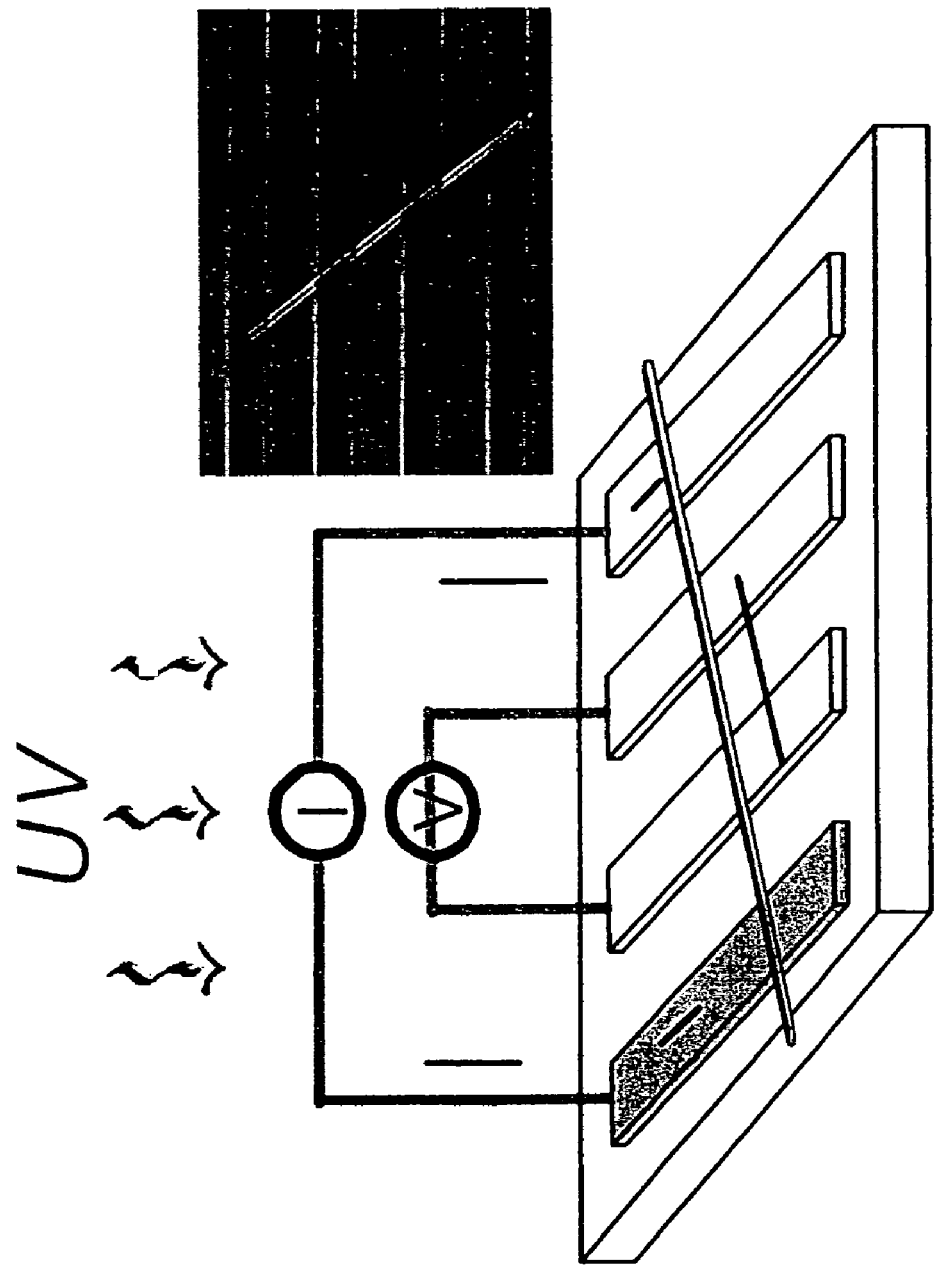
FIG. 13 illustrates a chemical sensing device assembly used in an experiment according to the present invention.

Our present experiment used a device 1300 illustrated in FIG. 13. As shown, the device includes a nanoribbon bridging four gold electrodes on an insulating substrate. The electrodes were wired to a voltage source and current meter. The other component is a low-intensity UV light source, which assumes the role of high temperatures in enhancing the absorption kinetics, as described below.

Our sensor setup takes special advantage of two properties of the nanoribbon morphology: the very large ratio of surface area to volume and the fact that the nanoribbon interior is highly affected by electrical changes resulting from chemistry at the surface. The electrical state of the surface thus dictates the conductance of the nanoribbon. UV-light above the bandgap of $SnO_2$ (e.g., 3.6 eV 345 nm) facilitates the $NO_2$ absorption/desorption process by providing photo-generated electrons and holes for trapping and recombination. We have found that the Ag-sensitized nanoribbons are responsive to 365 nm light as well.

Figure 14:
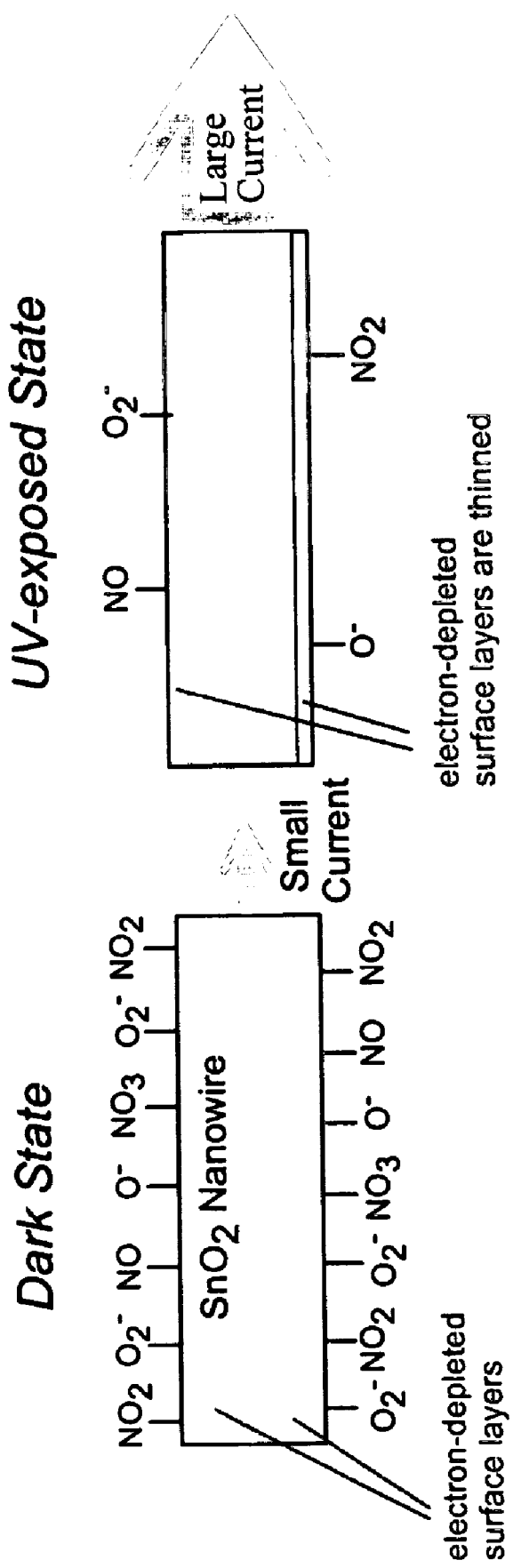
FIG. 14 depicts a difference between the dark and illuminated states of a nanowire chemical sensor (In the dark, a high coverage of absorbed $NO_2$ widens the depletion layer and results in low conductivity. Upon UV-illumination, much $NO_2$ desorbs, thinning the depletion layer and greatly raising the conductivity. The device is operated in the UV-exposed state.)
Figure 15:
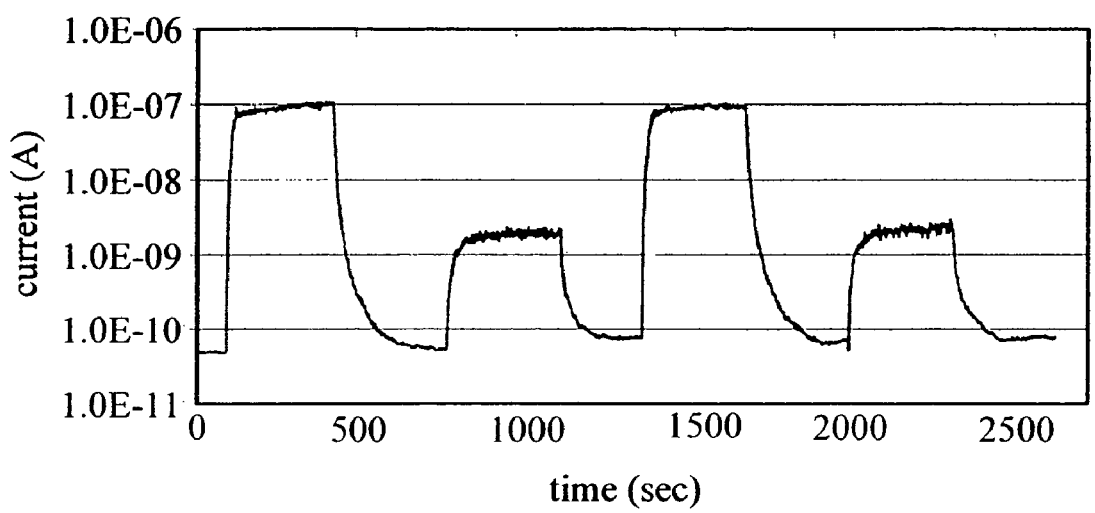
FIG. 15 illustrates a photoresponse of a typical $SnO_2$ nanowire cycled between 254 nm UV (large steps), 365 nm UV (small steps) and vacuum (troughs) in an atmosphere of 100 ppm $NO_2$ in dry air. (The photoresponse at 254 nm is 103.25. Bias is 0.5 V)

The sensing mechanism specific to our $SnO_2$ nanoribbons seems to operate as follows. In the dark and in a $NO_2$/air mixture, $NO_2$ molecules absorb on the nanoribbon surface and partly dissociate into a variety of species, including $NO_2$, NO, O and perhaps $NO_3$. Absorption of $NO_2$ molecules scavenges free electrons from the n-type nanoribbon and widens the electrical double layer, or depletion layer, at the surface, with a corresponding drop in the electrical conductivity. Our nanoribbons are thin enough for the depletion layer to extend throughout the structure in the dark state, leading to a very high (1-10 G) resistance. When UV-light near the bandgap is applied, photo-generated holes migrate to the surface and recombine with the trapped electrons, effectively desorbing a variety of negatively-charged species residing there. The depletion layer thins and conductance increases greatly, typically by 3 to 4 orders of magnitude (see FIG. 14). As shown, in the dark, a high coverage of absorbed $NO_2$ widens the depletion layer and results in low conductivity. Upon UV-illumination, much $NO_2$ desorbs, thinning the depletion layer and greatly raising the conductivity. The device is operated in the UV-exposed state. Additionally, FIG. 15 shows a photoresponse of a typical wire to 254 nm UV illumination according to our experiments. Here, we have illustrated a photoresponse of a typical $SnO_2$ nanowire cycled between 254 nm UV (large steps), 365 nm UV (small steps) and vacuum (troughs) in an atmosphere of 100 ppm $NO_2$ in dry air. The photoresponse at 254 nm is 103.25. Bias is 0.5 V.

Figure 16:
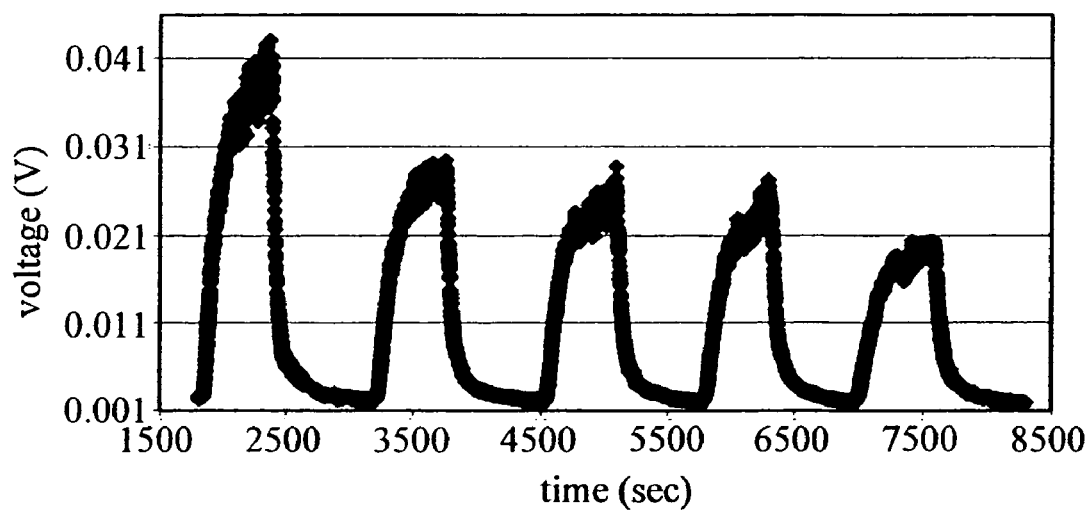
FIG. 16 depicts the behavior of a single nanoribbon as it was cycled between vacuum and various $NO_2$ concentrations in dry air under constant UV exposure.

We have found that by operating under continuous UV illumination, it is possible to reliably and reproducibly sense $NO_2$ under "artificial" and working-environment type conditions. UV illumination acts to maintain the device in a dynamic state so that the molecular absorption is highly reversible and response times are fast. FIG. 16 depicts the behavior of a single nanoribbbn as it was cycled between vacuum and various $NO_2$ concentrations in dry air under constant UV exposure. The sensor resolution limit is typically 5-15 ppm under these artificial cycling conditions, in which the nanoribbon surface is "cleaned" by each vacuum exposure. The conductance ratio between 100 ppm $NO_2$ and 0 ppm $NO_2$ is about 40.

Figure 17:
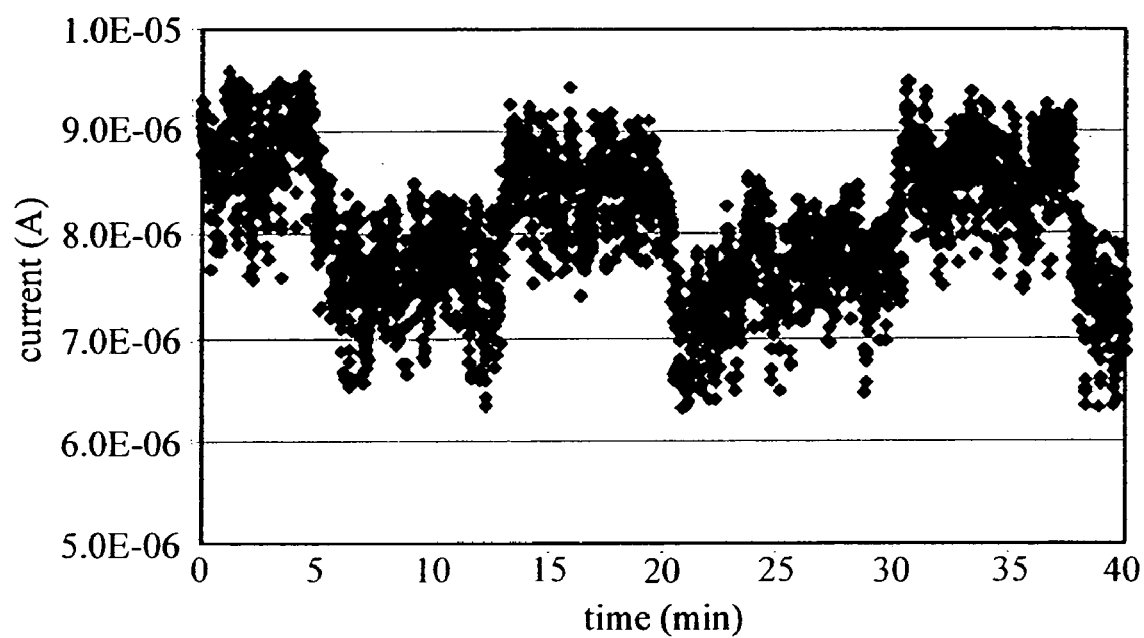
FIG. 17 shows $SnO_2$ nanowire cycled between 0 ppm $NO_2$ (high values) and 3 ppm $NO_2$ (low values) at a constant flow rate of 150 sccm while under 365 nm UV illumination. Bias is 0.5 V.

FIG. 17 illustrates a response of a $SnO_2$ nanowire device cycled between vacuum (4×10–5 mbar) and various concentrations of $NO_2$ while under constant 254 nm UV exposure. $NO_2$ levels are 25, 15, 10, 5 and 0 ppm with increasing time. The resolution limit is about 10 ppm. The current was held constant at 5 nA during the experiment. Under realistic cycling conditions with continuous gas flow, the sensor resolution limit varies from 20 ppm to better than 3 ppm. The conductance ratio between 100 ppm and 0 ppm is typically 10-12 under these conditions. The sensors fully respond to rising $NO_2$ levels within 10-50 seconds and falling $NO_2$ levels within 1-5 minutes under realistic (150 sccm) gas fluxes. The difference in response times reflects the relatively strong absorption of $NO_2$—easy on, less easy off. As shown, FIG. 17 shows one nanowire sensor cycled between 0 ppm and 3 ppm, displaying an average conductance change of 15%. This concentration is near, but not quite down to, the resolution limit.

Our $SnO_2$ nanoribbon $NO_2$ sensors, which couple photoconductivity with surface chemistry to sense important gas-phase molecules, show great promise for use in industry, automobiles and environmental monitoring. These devices are fast and show high sensitivity and stability. Metal oxide nanoribbons and nanowires possess a rich surface chemistry and the potential for using our $SnO_2$ devices to sense other interesting gases (e.g. CO, $CH_4$) is good. Of course, this also means that the selectivity of our devices is not intrinsically high-water is a particular problem. Work must also be done toward investigating the long-term stability of these small sensing elements if real-world applications are the goal. Better sensitivity and selectivity will be achieved by decorating the nanoribbon surface with other elements, doping is also a tool being actively considered, in order to tune the density of states at the surface. Experiments are now underway in our lab to probe the nature of the $NO_2$ species absorbed on the ribbon surface in order to gain the microscopic understanding that will be necessary for advances toward single molecule detection.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A nanowire switching device comprising:
   a nanowire structure comprising an elongated member having a cross-sectional diameter ranging from about 1 nanometers but less than about 300 nanometers;
   a first terminal coupled to a first portion of the nanowire structure;
   a second terminal coupled to a second portion of the nanowire structure, the second portion of the nanowire structure being disposed spatially from the first portion of the nanowire structure; and
   an active surface structure comprising a first chemical species coupled to the nanowire structure, the active surface structure extending from the first portion to the second portion along the elongated member;
   whereupon the nanowire structure has a first conductivity value as measured between the first terminal and the second terminal while the active surface is subjected to a first intensity of electro-magnetic radiation illumination, the nanowire structure having a second conductivity value as measured between the first terminal and the second terminal while the active surface is subjected to a second intensity of electro-magnetic radiation illumination;
   wherein the electromagnetic radiation illumination releases a portion of the first chemical species from the active surface structure.

2. The device of claim 1 wherein the device is at least one of a switch, a sensor, a chemical sensor, photo-detector, opto-electronic device, MEMS, or MEOMS.

3. The device of claim 1 wherein the device is a humidity sensor or an oxygen sensor.

4. The device of claim 1 wherein the nanowire structure is characterized by a shape of a nanowire.

5. The device of claim 1 wherein the active surface is about 10% to 90% of a total surface area of the nanowire structure.

6. The device of claim 1 wherein the cross-sectional diameter ranges from about 1 nm to 5 nm.

7. The device of claim 1 wherein the nanowire structure has an aspect ratio (length to diameter) of 10 to 1000.

8. The device of claim 1 wherein the nanowire is made of a material that substantially single crystal.

9. The device of claim 1 wherein the nanowire is made of a material that is polycrystalline.

10. The device of claim 1 wherein the nanowire structure is made of a material that is a semiconductor.

11. The device of claim 10 wherein the semiconductor material is ZnO, SiGe, Si, Ge, $SnO_2$, GaN, PbSe, PbS, or $Bi_2Te_3$.

12. The device of claim 1 wherein nanowire structure comprises at least a first material and a second material that are spatially separated from each other.

13. The device of claim 1 wherein the nanowire structure is made of a homogeneous material.

14. The device of claim 1 wherein the nanowire is heterogeneous in texture.

15. The device of claim 1 wherein the second intensity level of the illumination is proportional to the second conductivity value.

16. The device of claim 1 wherein the device is operable at room temperature.

17. The device of claim 1 wherein the device is substantially free from high temperature thermal elements.

18. The device of claim 1 wherein the device is operable at 0 to 100 Degrees Celsius.

19. A method for switching an opto-electronic device, the method comprising:
   providing a nanowire structure having a surface region, the surface region having a first chemical species attached to the surface region of the nanowire structure, the nanowire structure having the first chemical species providing a first electrical state of the nanowire structure; and
   illuminating energy onto the surface region of the nanowire structure to change the nanowire structure having the first chemical species from the first electrical state to a second electrical state whereupon the second electrical state allows a conduction characteristic of the nanowire to change from the first electrical state to the second electrical state,
   wherein the illuminating releases a portion of the first chemical species from the surface region of the nanowire structure.

20. The method of claim 19 wherein the illuminating releases a portion of the first chemical species from the surface area of the nanowire structure.

21. The method of claim 19 wherein the illuminating converts the first chemical species into the second chemical species.

22. The method of claim 19 wherein the energy is electromagnetic radiation.

23. The method of claim 19 wherein the nanowire structure is made of a semiconductor material.

24. The method of claim 23 wherein the semiconductor material is selected from ZnO, SiGe, Si, Ge, $SnO_2$, $TiO_2$, and GaN.

25. The method of claim 19 wherein the nanowire structure is single crystalline or polycrystalline.

26. A nanowire opto-electronic switching device comprising:
- a nanowire structure comprising an elongated member having a cross-sectional diameter ranging from about 1 nanometers but less than about 300 nanometers;
- a first terminal coupled to a first portion of the nanowire structure;
- a second terminal coupled to a second portion of the nanowire structure, the second portion of the nanowire structure being disposed spatially from the first portion of the nanowire structure; and
- an active surface structure comprising a first chemical species coupled to the nanowire structure, the active surface structure extending from the first portion to the second portion along the elongated member;
- whereupon the nanowire structure has a first resistance value as measured between the first terminal and the second terminal while the active surface is subjected to a first level of electromagnetic radiation, the nanowire structure having a second resistance value as measured between the first terminal and the second terminal while the active surface is subjected to a second level of electromagnetic radiation,
- wherein the release of a portion of the first chemical species from the active surface structure varies with the intensity of electro-magnetic radiation from the first level of electro-magnetic radiation and the second level of electromagnetic radiation.

* * * * *